(12) United States Patent
Bains et al.

(10) Patent No.: US 9,436,632 B2
(45) Date of Patent: *Sep. 6, 2016

(54) ACCESSING DATA STORED IN A COMMAND/ADDRESS REGISTER DEVICE

(71) Applicant: Intel Corporation, Santa Clara, CA (US)

(72) Inventors: Kuljit S. Bains, Olympia, WA (US);
Klaus J. Ruff, Beaverton, OR (US);
George Vergis, Portland, OR (US);
Suneeta Sah, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/560,976

(22) Filed: Dec. 4, 2014

(65) Prior Publication Data

US 2015/0089111 A1   Mar. 26, 2015

Related U.S. Application Data

(63) Continuation of application No. 13/995,477, filed as application No. PCT/US2011/066891 on Dec. 22, 2011.

(51) Int. Cl.
*G06F 13/28* (2006.01)
*G06F 11/10* (2006.01)
*G06F 11/16* (2006.01)
*G11C 29/44* (2006.01)
*G06F 13/16* (2006.01)

(52) U.S. Cl.
CPC .............. *G06F 13/28* (2013.01); *G06F 11/10* (2013.01); *G06F 11/1016* (2013.01); *G06F 11/1612* (2013.01); *G06F 13/16* (2013.01); *G11C 29/44* (2013.01); *G11C 2029/4402* (2013.01)

(58) Field of Classification Search
CPC .... G06F 13/28; G06F 13/16; G06F 11/1016; G06F 11/1612; G06F 11/10; G11C 29/44; G11C 2029/4402
See application file for complete search history.

(56) References Cited

U.S. PATENT DOCUMENTS

| 5,535,404 A | 7/1996 | Rsubota |
| 6,363,018 B1 * | 3/2002 | Manning .............. G11C 7/1051 365/189.05 |

(Continued)

FOREIGN PATENT DOCUMENTS

| CN | 1153347 | 7/1997 |
| CN | EP1021794 | 9/2006 |

(Continued)

OTHER PUBLICATIONS

Arimoto, K.; Matsuda, Y.; Furutani, K.; Tsukude, M.; Ooishi, T.; Mashiko, K.; Fujishima, K., "A speed-enhanced DRAM array architecture with embedded ECC," in Solid-State Circuits, IEEE Journal of , vol. 25, No. 1, pp. 11-17, Feb. 1990.*

(Continued)

*Primary Examiner* — Cynthia Britt
(74) *Attorney, Agent, or Firm* — Blakely, Sokoloff, Taylor & Zafman LLP

(57) ABSTRACT

A register not connected to a data bus is read by transferring data across an address bus to a device connected to the data bus, from which the data is read by a device connected to the data bus. The register resides in a register device connected via the address bus to a memory device that is connected to both the address bus and the data bus. A host processor triggers the register device to transfer information over the address bus to a register on the memory device. The host processor then reads the information from the register of the memory device.

20 Claims, 6 Drawing Sheets

(56) References Cited

U.S. PATENT DOCUMENTS

| | | | |
|---|---|---|---|
| 6,763,448 B1* | 7/2004 | Mitsuishi | G06F 13/28 |
| | | | 712/39 |
| 8,595,428 B2* | 11/2013 | Bains | G06F 13/1678 |
| | | | 711/105 |
| 2003/0120980 A1 | 6/2003 | Harris | |
| 2003/0126413 A1* | 7/2003 | El-Kik | G06F 9/345 |
| | | | 712/225 |
| 2004/0059721 A1 | 3/2004 | Patzer | |
| 2004/0139305 A1* | 7/2004 | Arimilli | G06F 9/30072 |
| | | | 712/227 |
| 2004/0205433 A1 | 10/2004 | Gower et al. | |
| 2005/0256988 A1* | 11/2005 | Arendt | G06F 13/423 |
| | | | 710/305 |
| 2006/0010292 A1 | 1/2006 | DeVale et al. | |
| 2006/0271739 A1* | 11/2006 | Tsai | G06F 3/0611 |
| | | | 711/123 |
| 2009/0119451 A1 | 5/2009 | Haywood et al. | |
| 2011/0066903 A1 | 3/2011 | Foster, Sr. et al. | |
| 2014/0372816 A1* | 12/2014 | Bains | G06F 11/10 |
| | | | 714/723 |
| 2015/0089111 A1 | 3/2015 | Bains | |

FOREIGN PATENT DOCUMENTS

| | | | | |
|---|---|---|---|---|
| CN | EP2275930 | | 1/2011 | |
| IL | WO 2009136402 A2 * | 11/2009 | | G06F 13/28 |
| KR | 10-1990-0016864 | | 11/1990 | |

OTHER PUBLICATIONS

Arimoto, K.; Fujishima, K.; Matsuda, Y.; Tsukude, M.; Oishi, T.; Wakamiya, W.; Satoh, Shin-ichi; Yamada, M.; Nakano, Takao, "A 60-ns 3.3-V-only 16-Mbit DRAM with multipurpose register," in Solid-State Circuits, IEEE Journal of , vol. 24, No. 5, pp. 1184-1190, Oct. 1989.*
International Search Report and Written Opinion from PCT/US2011/066891 mailed Aug. 28, 2012, 8 pages.
International Preliminary Report on Patentability for PCT International Application No. PCT/US2011/066891, mailed Jul. 3, 2014, 5 pages.
Notice of Preliminary Rejection dated Nov. 9, 2015 (+ English translation), in Korean Patent Application No. 10-2014-7036819, 10 pages.
Notice of Preliminary Rejection mailed Nov. 6, 2015 (+ English translation), in Korean Patent Application No. 10-2014-7016567, 12 pages.
Arimoto, K. et al., "A 60-ns 3.3-V-only 16-Mbit DRAM with multipurpose register," in Solid-State Circuits, IEEE Journal of, vol. 24, No. 5, pp. 1184-1190, Oct. 1989.
Arimoto, K. et al., "A speed-enhanced DRAM array architecture with embedded ECC," in Solid-State Circuits, IEEE Journal of, vol. 25, No. 1, pp. 11-17, Feb. 1990.
English translation of First Office Action and Search Report dated Dec. 28, 2015, in Chinese Application No. 20180075692.0, 9 pages.
Office Action mailed Jan. 14, 2016, in U.S. Appl. No. 13/995,477, 10 pages.

* cited by examiner

ACCESSING DATA STORED IN A COMMAND/ADDRESS REGISTER DEVICE

CROSS-REFERENCE TO RELATED APPLICATIONS

This application is a continuation of U.S. patent application Ser. No. 13/995,477 filed Aug. 21, 2014, which is a national phase application of International Patent Application No. PCT/US2011/066891 filed Dec. 22, 2011. These applications are incorporated herein by reference in their entireties.

FIELD

Embodiments of the invention are generally related to memory devices, and more particularly to accessing data stored in a register device on a memory address or command bus.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright©2011, Intel Corporation, All Rights Reserved.

BACKGROUND

Certain memory subsystems include register devices connected to the address or command bus of the memory subsystem to store values related to a command or a configuration within the memory subsystem. Traditionally there is no good way to access such data. Thus, data stored in the register for purposes of configuration (e.g., data stored in a Mode Register) or data stored for debug or error detection purposes (e.g., data stored in a C/A register device) or other data in another such register is not easily accessible.

One option to access the data is to include a connection to the data bus of the memory subsystem. Such an option is very expensive in terms of hardware (extra pins) and routing of traces. Another option is to put the device in a special state (e.g., a management mode) to temporarily allow repurposing of the existing buses or other connections. Such an option results in a slow connection, and does not allow continued operation of the device, and may still require additional hardware. Another option is to provide an out-of-band serial interface on the register device, which also adds hardware and routing costs. Thus, there are currently no traditional mechanisms that allow access to the data stored in registers of the memory subsystem with standard commands with minimal hardware requirements.

Memory subsystems that support newer standards of DDR (dual data rate) memory add an additional circumstance of providing a register and logic for performing parity error checking at the register device instead of at the memory device. For example, DDR4 (standard still in development as of the filing of this application) will allow command/address (C/A) parity error checking off the DRAM (dynamic random access memory) device. However, without a mechanism to read a parity error, the command will still be send to the DRAM for execution, which would result in hanging the computing device (for example, a "blue screen" condition).

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DETAILED DESCRIPTION

As described herein, a register in a memory subsystem is connected to an address bus. It will be understood that reference to an address bus could refer to a bus that carries only addresses, or to a bus that carries addresses and commands. Many address buses are both address or command buses in that both addresses, commands, or combinations of addresses and commands are sent over the buses. Reference herein to an "address bus" will be understood to refer to an address or command bus. Thus, a register is accessible via an address or command bus, but not a data bus. The data can be read by transferring data across the address bus from the register to a device connected to the data bus, from which the data is read over the data bus even though the register is not connected to the data bus. The register resides in a register device connected via the address bus to a memory device that is connected to both the address bus and the data bus. A host processor triggers the register device to transfer information over the address bus to a register on the memory device. The host processor then reads the information from the register of the memory device. With such a read mechanism, an "indirect" read of the register is possible.

The read mechanism works with any register device coupled to the address bus, such as a Mode Register or a parity error checking register device. A specific memory configuration is thus accessible during normal runtime execution of the host operating system. Additionally, it is possible to access data regarding a specific command or address that resulted in a parity error, which can prevent access and fault of the host system. It is thus possible through the described read mechanism to perform error recovery of the system when an error occurs in the memory command.

The indirect read of the register works well in proposed DDR4 systems. DDR4 specifies a register device that can perform C/A parity error checking, and store offending commands. Thus, in DDR4, the command can be stopped before execution and the mechanism to access the offending command helps in pinpointing the offending command, which in turn helps in error recovery.

Figure 1:
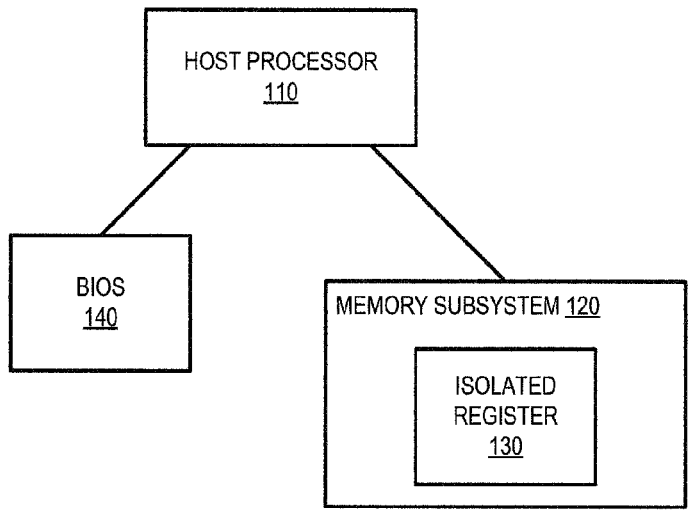
FIG. 1 is a block diagram of an embodiment of a system having a memory subsystem with a register accessible via an address or command bus but not a data bus.

FIG. 1 is a block diagram of an embodiment of a system having a memory subsystem with a register accessible via an address bus but not a data bus. System 100 represents a computing device or mobile device in which isolated register 130 is isolated from host processor 110. Host processor 110 executes instructions stored in memory subsystem 120. Host processor 110 generally issues a command to access data. The command can include a physical o a virtual address, which points to a specific memory location within memory devices of memory subsystem 120.

Isolated register 130 is not directly accessed by host processor 110. Register 130 is thus "isolated" from direct access by host processor 110, even though it is connected to elements of memory subsystem 120, such as an address bus, which is also connected to a memory controller and memory devices (see FIGS. 2 and 3 below for more detailed examples). System 100 includes a control mechanism as is known in the art to load data and code or instructions into memory subsystem 120 for execution by processor 110.

In one embodiment, host processor 110 issues a command that causes data to be stored in register 130, which cannot then be directly accessed by host processor 110. Examples include Mode Register values, certain debug values, parity error information, or other information. In such an embodiment, host processor 110 issues a command that is forwarded to register 130 to cause the register to copy or transfer its contents to a register on a memory device of memory subsystem 120. The memory device is connected to a data bus, and can thus respond to a command from host processor 110 by loading data onto the data bus, which is readable by host processor 110.

In one embodiment, BIOS (basic input/output system) 140 includes code that can be executed by host processor 110 to trigger a read of register 130, and process the contents stored in it. For example, host processor 110 can be configured to access debug or error correction code stored in BIOS 140 on the occurrence of certain events. Thus, host processor 110 can be made to execute a debug state or an error correction state that will access the contents of register 130 and determine what actions to take in response to the contents read.

Figure 2:
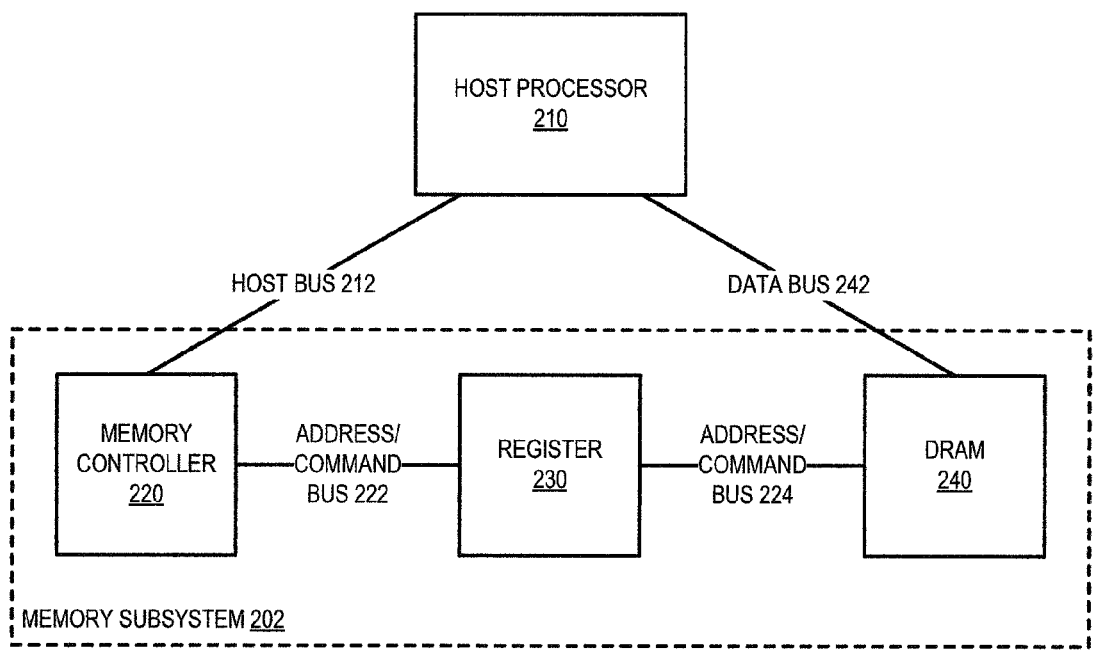
FIG. 2 is a block diagram of an embodiment of a system having a memory subsystem with a register between a memory controller and a DRAM device.

FIG. 2 is a block diagram of an embodiment of a system having a memory subsystem with a register between a memory controller and a DRAM device. System 200 represents a computing device or mobile device in which a register is located between memory controller 220 and DRAM 240, and can be one example of system 100 of FIG. 1. Host processor 210 executes instructions stored in memory subsystem 202. Host processor 210 can access data or code stored in DRAM 240 for execution of instructions. In one embodiment, memory subsystem 202 includes other memory resources (not shown) in addition to DRAM 240.

Host processor 210 accesses DRAM 240 by generating a command or request that it sends to memory controller 220 over host bus 212. Host bus 212 represents any connections through which host processor 210 can provide a command or request related to memory access. In one embodiment, memory controller 220 sends all access requests through register 230, instead of directly to DRAM 240. In another embodiment (see, for example, FIG. 3 below), memory controller can access DRAM 240 directly, and register 230 sits on an address bus to which the memory controller and DRAM are connected.

In one embodiment, address bus 222 and address bus 224 both represent the address bus of memory subsystem 202, where address bus 222 is the address bus as between memory controller 220 and register 230, and address bus 224 is the address bus as between register 230 and DRAM 240. Register 230 can sit on the address bus between memory controller 220 and DRAM 240 to perform an operation on access commands sent by memory controller 220 to DRAM 240. In one embodiment, memory controller 220 sends all commands to DRAM 240 through register 230. For example, in one embodiment, register 230 provides parity error checking. In the case of a detected parity error, register 230 does not forward the offending command. Thus, having register 230 in between memory controller 220 and DRAM 240 can prevent the DRAM operating on a bad command that would otherwise cause device 200 to become unresponsive (i.e., hung).

In an implementation where register 230 provides parity error checking, register 230 logs information regarding parity error when it is detected. When parity error is detected, in addition to stopping the command from reaching DRAM 240, register 230 triggers parity error, which is detected by memory controller 220 and/or DRAM 240. However parity error is indicated in system 200, host processor 210 detects the parity error and can attempt to read the contents of register 230 to obtain the parity error log information. The register can then transfer its contents to DRAM 240 in response to a read command to enable host processor 210 access to the error log for a determination of how to proceed. Host processor 210 can access the transferred contents of register 230, as well as other information stored on DRAM 240, over data bus 242. DRAM 240 is connected to data bus 242, whereas register 230 is not.

Figure 3:
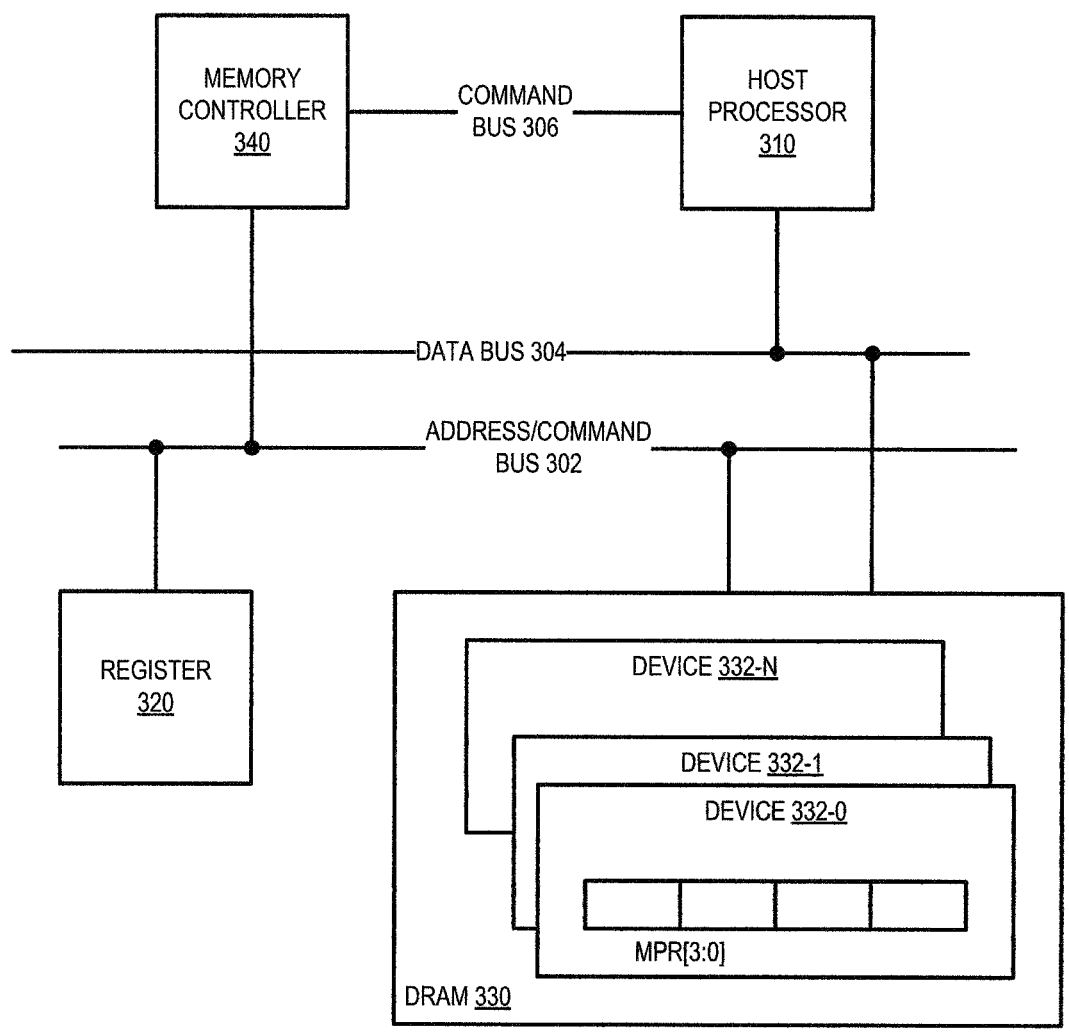
FIG. 3 is a block diagram of an embodiment of a system having a memory subsystem with a register accessible via an address or command bus but not a data bus, and a memory device accessible via both the address or command bus and data bus.

FIG. 3 is a block diagram of an embodiment of a system having a memory subsystem with a register accessible via an address bus but not a data bus, and a memory device accessible via both the address bus and data bus. System 300 represents a computing device in which host processor 310 accesses data indirectly from register 320. System 300 can be one example of system 100 of FIG. 1.

Whereas register 230 of FIG. 2 is connected between the memory controller and memory device, register 320 is not connected between memory controller 340 and DRAM 330. Instead, register 320 is connected to memory controller 340 in parallel with DRAM 330 over address bus 302. Register 320 is not connected to data bus 304. DRAM 330 is connected to data bus 304. Memory controller 340 may or may not be connected to data bus 304. In one embodiment, memory controller 340 is coupled to host processor 310 via command bus 306, which may or may not be part of data bus 304.

Register 320 logs information such as memory configuration values or debug values. When host processor 310 executes instructions that indicate reading the value(s) logged in register 320, host processor 310 issues a command over command bus 306 to memory controller 340, which then provides a command on address bus 302. Host processor 310 is not directly connected to address bus 302. Register 320 responds to the command by transferring data to DRAM 330 over address bus 302.

In one embodiment, the command for register 320 causes register 320 to transfer to a specific location in DRAM 330. The register specifies the location with selection code or selection information. Thus, a read trigger command can indicate a register of DRAM 330 to which the log information should be written. In one embodiment, DRAM 330 includes multiple memory devices, 332-0, 332-1, . . . , 332-N, where N is an integer greater than or equal to zero. In one embodiment, each device includes one or more multipurpose registers (MPRs), illustrated in device 332-0 as MPR[3:0]. There can be more or fewer than four registers in each DRAM device.

In one embodiment, memory controller 340 selects the location to which register 320 writes its contents by selecting a location selection and/or write enable for the desired location in DRAM 330. The read trigger that causes register 320 to transfer its contents to DRAM 330 can include a selection code to indicate a specific MPR. In one embodiment, the format of the read trigger indicates register 320 as the transfer source, which is to write into a specified MPR as the destination. Thus, the read trigger can be a command similar in structure to other standard commands in system 300.

In general, the read trigger causes register 320 to transfer log information to a register on DRAM 330, which can then be read by host processor 310. Host processor 310 issues a command that ultimately causes read trigger to be sent to register 320. In one embodiment, the command from host processor 310 is considered the read trigger, and is forwarded by memory controller 340. In another embodiment, host processor 310 issues a command that causes memory controller to generate a read trigger, which it then sends to register 320.

Figure 4:
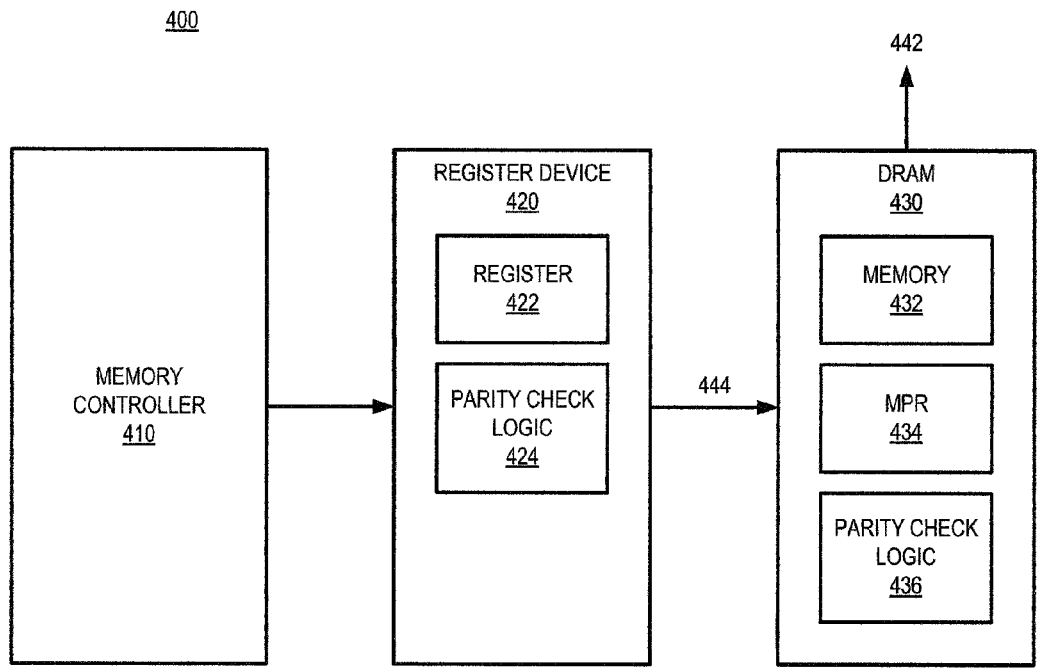
FIG. 4 is a block diagram of an embodiment of a system having a memory subsystem with a register device between a memory controller and a DRAM device, where the register device performs parity checking.

FIG. 4 is a block diagram of an embodiment of a system having a memory subsystem with a register device between a memory controller and a DRAM device, where the register device performs parity checking. As mentioned above with respect to the examples of FIGS. 1 and 2, in one embodiment a register device disposed between the memory controller and the memory device can perform parity checking. In system 400, register device 420 is located between memory controller 410 and DRAM 430.

Register device 420 includes register 422 where it logs parity checking information. Register 422 is a register in accordance with any embodiment known in the art. Briefly, a register includes a volatile group of digital bits held in a group of circuit elements. In one embodiment, register device 420 also includes parity check logic 424, which represents hardware and/or software executed on processing resources to perform parity check functions. Parity checking is generally a fairly simple logical operation to check that a calculated parity matches an expected parity, and can be easily implemented in simple digital circuits.

Register device 420 is connected to DRAM 430 via address bus 444. DRAM 430 is connected to a host processor via data bus 442. DRAM 430 includes memory resources 432 that store the data in the DRAM. DRAM 430 also includes one or more MPRs 434, which can function essentially as a small scratch pad for the DRAM device. In one embodiment, DRAM 430 includes parity check logic 436, which can be implemented in a manner similar to parity check logic 424 of register device 420. In one embodiment, either or both of parity check logic 424 and parity check logic 436 are selectively enabled. Thus, parity checking can be enabled or disabled at both register device 420 and DRAM 430. In one embodiment, when parity checking is enabled at register device 420, it is disabled at DRAM 430.

Assume for the following description that parity check logic 424 is enabled. If parity check logic 424 detects a parity error, it logs parity error information in register 422, which can be a C/A register. Register device 420 transfers the error log information and error status information to DRAM 430. The same mechanism that register device 420 uses to transfer error log information and error status information to DRAM 430 can be used to transfer control words from register device 420.

In one embodiment, register device 420 is on a DIMM (dual inline memory module). System 400 sets the bits of register 422 by issuing an address command from memory controller 410. Based on the address, register device 420 sets bits in register 422. As described herein, standard address commands can then be used to cause register device 420 to transfer data to MPR 434 to be read over data bus 442. Since register device 420 is isolated from data bus 442, it cannot directly place data on the data bus for access by a host processor.

In one embodiment, register device 420 is set up to check for a parity (PAR) signal that is generated one clock after a chip select signal (CS#). In an alternate embodiment, the parity signal can be generated in the same clock cycle as CS#, instead of the clock cycle+1. Register device 420 checks for parity with no errors before forwarding the command to DRAM 430. The transfer of the error log from register device 420 would work the same whether or not parity check logic 436 is enabled in DRAM 430 (i.e., whether or not the DRAM is checking for parity errors).

In one embodiment, the process for logging and reading out the log information from register device 420 is as follows. The process allows recovery from parity error, whereas with traditional approaches a parity error would cause system failure. Register device 420 detects a parity error in the command or address. Register 422 logs the errant C/A (column/address) frame (RCW (register control word) location C0 . . . FF). In one embodiment, bits that are logged are C2-C0, ACT_n, BG1-BG0, BA1-BA0, PAR, A17, A16/RAS_n, A15/CAS_n, A14/WE_n, and A13:0, for a total of 26 bits. Register device 420 sets the parity error status bit to '1' to indicate the parity error in system 400. One significant contrast from prior parity error checking techniques is that register device 420 can prevent an erroneous instruction from being executed by holding the errant C/A frame, and not forwarding it to DRAM 430.

In one embodiment, register device 420 asserts a signal to memory controller 410 to indicate the parity error. The signal could be an ALERT_n signal asserted to the memory controller after a delay of tPAR_ALERT_ON_reg for duration of tPAR_ALERT_PW_reg. Register device 420 disables parity checking when a parity error is detected, and will only resume parity checking after memory controller 410 resets a parity error status bit to '0'.

In one embodiment, MPR 434 includes multiple MPR registers, which have different ranks. In one embodiment, MPR Page 0 is a readable and writeable register, whereas MPR Pages 1, 2, 3 are read-only. Thus, memory controller 410 can enable a 'MPR Page 0' mode in DRAM 430 in rank 0 by setting MR3 bit A2=1 and A1:A0=00 (page 0). Reads and writes can thus be directed to Page 0.

In one embodiment, memory controller 410 selects the error log register in an RCW election control word and initiates one or more commands to write the contents of register 422 to MPR Page 0. In one embodiment, memory controller 410 issues four 'Send 8-bit RCW to MPR' commands by writing to a Command Space control word (address 3F) four times. Such a sequence can transfer 32 bits (which may be the entire size of register 422) of the error log register to page 0 of MPR0, MPR1, MPR2 and MPR3. Using rank 0 on the DIMM for MPR writes is a convenient when all DIMMs have rank 0. Other ranks could be used instead of rank 0.

be readable only. If Page 1 is read-only, information can be written to a writeable page (e.g., Page 0) with the same mapping so that the same commands and processing can be used to understand the error information.

In one example embodiment, a write to Page 0 (MPR1) is a write transaction with BA1:BA0=00 and address A7:A0 mapped as follows:

| A[15]/CAS# | A[14]/WE# | A[13] | A[12] | A[11] | A[10] | A[9] | A[8] |
|---|---|---|---|---|---|---|---|

After the error log and the error status have been transferred from register 422 to DRAM Page0, memory controller 410 can use read commands to read Page 0. Thus, a host processor can generate read commands to cause the memory controller to use read commands to access the data.

Memory controller 410 can disable MPR operation by programming MR3 A2=0 to DRAM, which initiates normal data flow. The memory controller can also enable parity checking again in register device 420 by resetting the parity error signal as mentioned above.

In one embodiment, the following register specification details can apply.

TABLE 1

RC3F: Command Space

| Cmd (DA[3:0]) | | | | Cmd No | Command Name | Result |
|---|---|---|---|---|---|---|
| 0 | 0 | 0 | 0 | CMD0 | Reserved | |
| 0 | 0 | 0 | 1 | CMD1 | Reserved | |
| 0 | 0 | 1 | 0 | CMD2 | Reserved | |
| 0 | 0 | 1 | 1 | CMD3 | Reserved | |
| 0 | 1 | 0 | 0 | CMD4 | Send 8-bit RCW to MPRx | Sends selected RCW to DRAM MPR0 page 0. |
| 0 | 1 | 0 | 1 | CMD5 | Send two 4-bit RCWs to MPRx | Sends selected RCWs to DRAM MPR0 page 0. |
| 0 | 1 | 1 | 0 | CMD6 | Reserved | |
| 0 | 1 | 1 | 1 | CMD7 | Reserved | |
| 1 | 0 | 0 | 0 | CMD8 | Reserved | |
| 1 | 0 | 0 | 1 | CMD9 | Reserved | |
| 1 | 0 | 1 | 0 | CMD10 | Reserved | |
| 1 | 0 | 1 | 1 | CMD11 | Reserved | |
| 1 | 1 | 0 | 0 | CMD12 | Reserved | |
| 1 | 1 | 0 | 1 | CMD13 | Reserved | |
| 1 | 1 | 1 | 0 | CMD14 | Reserved | |
| 1 | 1 | 1 | 1 | CMD15 | Reserved | |

TABLE 2

RC8x: RCW Selection Control Word definition for 8-bit RCWs

| | Setting (DA[7:0]) | | | | | | Definition | Encoding |
|---|---|---|---|---|---|---|---|---|
| 0 | MPR bit 1 | MPR bit 0 | A12 | A11 | A10 | A9 | A8 | RCW address for RCW read operation | Selects 1 out of 32 8-bit RCW addresses<br>MPR bits[1:0] = 00 selects MPR0<br>MPR bits[1:0] = 01 selects MPR1<br>MPR bits[1:0] = 10 selects MPR2<br>MPR bits[1:0] = 11 selects MPR3 |
| 1 | MPR bit 1 | MPR bit 0 | A12 | A11 | A10 | A9 | A8 | RCW address for RCW read operation with auto-increment[1] | Selects 1 out of 32 8-bit RCW addresses<br>MPR bits[1:0] = 00 selects MPR0<br>MPR bits[1:0] = 01 selects MPR1<br>MPR bits[1:0] = 10 selects MPR2<br>MPR bits[1:0] = 11 selects MPR3 |

In one embodiment, for convenience the mapping of bits to Page 0 can follow the same pattern as the mapping of bits in Page 1. Page 1 is used by DRAM for error logs, but may

[1] Send 8-bit RCW to MPRx' commands auto-increment the address field by 1 and the MPR bits field in the RCW Selection Control Word by 1.

TABLE 3

| | | | | | | | |
|---|---|---|---|---|---|---|---|
| RC4x: RCW Selection Control Word definition for 4-bit RCWs | | | | | | | |
| Setting (DA[7:0]) | | | | | | Definition | Encoding |
| 0 | MPR bit 1 | MPR bit 0 | A9 A8 A7 A6 A5 | | | RCW address for RCW read operation | Selects 1 out of 32 dual 4-bit RCW addresses<br>MPR bits[1:0] = 00 selects MPR0<br>MPR bits[1:0] = 01 selects MPR1<br>MPR bits[1:0] = 10 selects MPR2<br>MPR bits[1:0] = 11 selects MPR3 |
| 1 | MPR bit 1 | MPR bit 0 | A9 A8 A7 A6 A5 | | | RCW address for RCW read operation with auto-increment[1] | Selects 1 out of 32 dual 4-bit RCW addresses<br>MPR bits[1:0] = 00 selects MPR0<br>MPR bits[1:0] = 01 selects MPR1<br>MPR bits[1:0] = 10 selects MPR2<br>MPR bits[1:0] = 11 selects MPR3 |

[1] 'Send two 4-bit RCWs to MPRx' commands auto-increment the address field by 1 and the MPR bits field in the RCW Selection Control Word by 1.

It will be understood that the register control word (RCW) is part of the register device. The DRAM device includes a Mode Register (MR), and the register device includes the RCW. The RCW and MR have a similar function for their two different associated devices. The memory controller first selects an RCW to read, and then writes the desired address (the address to read) as the source. The memory controller can then generate a destination control word to specify the destination (the address to write to). Every selected bit in the command space control word is used to define the command. There may be bits that are reserved or otherwise not used.

To accomplish a write of the register contents, in one embodiment, the memory controller sets the source, sets the destination, and then sets the Command Space Control Word, which generates and sends out the control word. The system can be configured so that merely setting the source and destination does not do anything in and of itself.

The RCW Selection Control Word is written prior to a 'Send 8-bit RCW to MPRx' or 'Send two 4-bit RCWs to MPRx' commands. In one embodiment, the register device sends the following bits on QxA[7:0] outputs:

TABLE 4

| Send RCW to DRAM bit assignment for 4-bit RCWs | | | | | | | |
|---|---|---|---|---|---|---|---|
| QxA7 | QxA6 | QxA5 | QxA4 | QxA3 | QxA2 | QxA1 | QxA0 |
| upper address RCW bit 3 | upper address RCW bit 2 | upper address RCW bit 1 | upper address RCW bit 0 | lower address RCW bit 3 | lower address RCW bit 2 | lower address RCW bit 1 | lower address RCW bit 0 |

TABLE 5

| Send to DRAM bit assignment for 8-bit RCW | | | | | | | |
|---|---|---|---|---|---|---|---|
| QxA7 | QxA6 | QxA5 | QxA4 | QxA3 | QxA2 | QxA1 | QxA0 |
| RCW bit 7 | RCW bit 6 | RCW bit 5 | RCW bit 4 | RCW bit 3 | RCW bit 2 | RCW bit 1 | RCW bit 0 |

In one embodiment, the control word locations C0 . . . FF function as a 32-bit error log register. In one embodiment, upon occurrence of a parity error, the register device logs the following sampled command and address bits in the Error Log Register, which can be transferred by the memory controller to page 0 of the DRAM MPR, where it can be read by the host system (via the processor).

TABLE 6

| RCC0 . . . RCFF: Error Log Register | | | | | | | | |
|---|---|---|---|---|---|---|---|---|
| Control Word | Setting (DA[7:0]) | | | | | | | |
| RCCx | A7 | | A6 | A5 | A4 | A3 | A2 | A1 | A0 |
| RCDx | A17/CAS_n | | A14/WE_n | A13 | A12 | A11 | A10 | A9 | A8 |

TABLE 6-continued

RCC0 . . . RCFF: Error Log Register

| Control Word | | Setting (DA[7:0]) | | | | | | |
|---|---|---|---|---|---|---|---|---|
| RCEx | DPAR | ACT_n | BG1 | BG0 | BA1 | BA0 | A17 | A16/RAS_n |
| RCFx | Reserved | CA Parity Error Status[1] | Reserved | | | C2 | C1 | C0 |

[1]The register device sets this bit upon occurrence of a CA parity error. Writing this bit to '0' resumes parity checking. While this bit is set and the device is in either one of the two cycle N + 1 parity modes, the device will not asssert any of its QxCSy_n outputs.

In one embodiment, the indirect read of a register device as described herein is applied to DDR4, which can be implemented with parity checking in a register device as described above. In more particular detail with respect to DDR4 MPR Mode, one embodiment of DDR4 DRAM contains four pages of MPR registers, and each page has four MPR locations. Page 0 has four 8 bit programmable MPR locations used for DQ bit pattern storage. These MPR registers are written by first placing the DRAM in 'Dataflow from/to MPR' mode by setting a mode register A2=1 in MR3. The MPR page is also set using bits A1:A0 in MR3.

In this mode, an MRS (mode register set) command is used to program the MPRs. For an MRS command, the address bus is used for the data. Once programmed, the registers can be accessed with read commands in 'MPR operation' mode to drive the MPR bits onto the DQ bus to the memory controller or host.

DDR4 MPR mode enable and page selection are accomplished by a Mode Register command as shown below.

TABLE 7

MR3

| Address | Operating Mode | Description |
|---|---|---|
| A2 | MPR operation | 0 = Normal |
| | | 1 = Dataflow from/to MPR |
| A1:A0 | MPR Selection | 00 = page0 |
| | | 01 = page1 |
| | | 10 = page2 |
| | | 11 = page3 |

As mentioned above, four MPR pages are provided in DDR4 SDRAM. Page 0 is for both read and write, and pages 1, 2, and 3 are read-only. Any MPR location (MPR0-3) in page 0 can be readable through any of three readout modes (serial, parallel, or staggered), but pages 1, 2, and 3 support only the serial readout mode.

After power up, the content of the MPR page 0 should have default values as predefined for the DRAM device. MPR page 0 can be writeable only when an MPR write command is issued by the memory controller. Unless an MPR write command is issued, the DRAM must keep the default values permanently, and should not change the content on its own for any purpose.

TABLE 8

MPR Default Values

| Address | MPR Location | [7] | [6] | [5] | [4] | [3] | [2] | [1] | [0] | NOTE |
|---|---|---|---|---|---|---|---|---|---|---|
| BA1:BA0 | 00 = MPR0 | 0 | 1 | 0 | 1 | 0 | 1 | 0 | 1 | Read/ |
| | 01 = MPR1 | 0 | 0 | 1 | 1 | 0 | 0 | 1 | 1 | Write |
| | 10 = MPR2 | 0 | 0 | 0 | 0 | 1 | 1 | 1 | 1 | (Default |
| | 11 = MPR3 | 0 | 0 | 0 | 0 | 0 | 0 | 0 | 0 | Value) |

It will be understood that reference, even detailed reference as provided above, with respect to DDR4 and DDR4 parity error checking, is merely a non-limiting example. As described herein, the indirect-read mechanism of the register can function for all registers that are isolated from a data bus, but coupled to a device that is coupled to the data bus.

Figure 5:
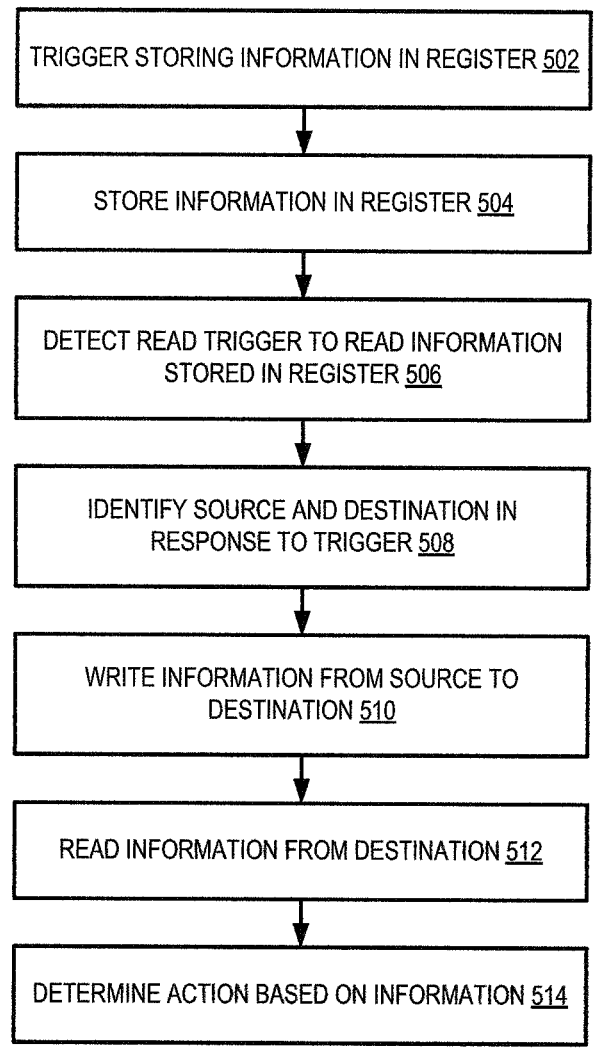
FIG. 5 is a flow diagram of an embodiment of a process for accessing data from a register accessible via an address or command bus but not a data bus.

FIG. 5 is a flow diagram of an embodiment of a process for accessing data from a register accessible via an address bus but not a data bus. In one embodiment, a memory controller sends a command to a register device that triggers the register device to store or log information in a register, 502. The information can be parity error information, debug information, configuration information, or other information that can be stored in a register isolated from the system data bus.

In one embodiment, the information to store in the register is configuration information, and the trigger is a command from the memory controller to write the configuration information. In one embodiment, the information to store is parity error information, and the trigger is detection by the register device that a parity error has occurred. In one embodiment, the information to store is debug information, and the trigger is a command from the memory controller in response to the debug software to write data to the register. In response to the trigger, the register device logs the information in the register, 504.

The memory controller detects a read trigger to read the information stored in the register, 506. The memory controller generally receives such a trigger from a process executed by the host processor. The process can be a program executing on the host, or it can be code stored in the device BIOS. In one embodiment, the memory controller prepares for reading the register by identifying a source and destination in response to the read trigger, 508. In one embodiment, the read trigger is a command that is of a form that identifies a specific register location as the source, and a specific MPR location of the memory device as the destination. The memory controller can prepare the command to the register device and DRAM identifying the specific locations based on the identification of the information to be read by the host.

In response to the command from the memory controller, the register device writes its contents (the source) to the MPR location specified (the destination), 510. The host can then read the information from the destination in the memory device with standard read commands over the system data bus, 512. The host that requested the information determines one or more actions based on the information read, 514. The actions can be related to setting or updating configuration, storing data in storage or sending data over a network, identifying a command with parity error and issuing a corrected command, or any other action.

In one embodiment, a BIOS controls at least certain command to the register device. For example, in response to a parity error, the BIOS can see that an error occurred, and then go back to the host to discover the specific error. The specific error is visible by reading the register device as set forth above. In one embodiment, in response to an error, the BIOS can attempt to read every device register in the system to figure out where the error came from, and what specifically the error is. The software controls the writing and reading of the registers and the commands. The BIOS then determines what actions to take based on the specific error.

Figure 6:
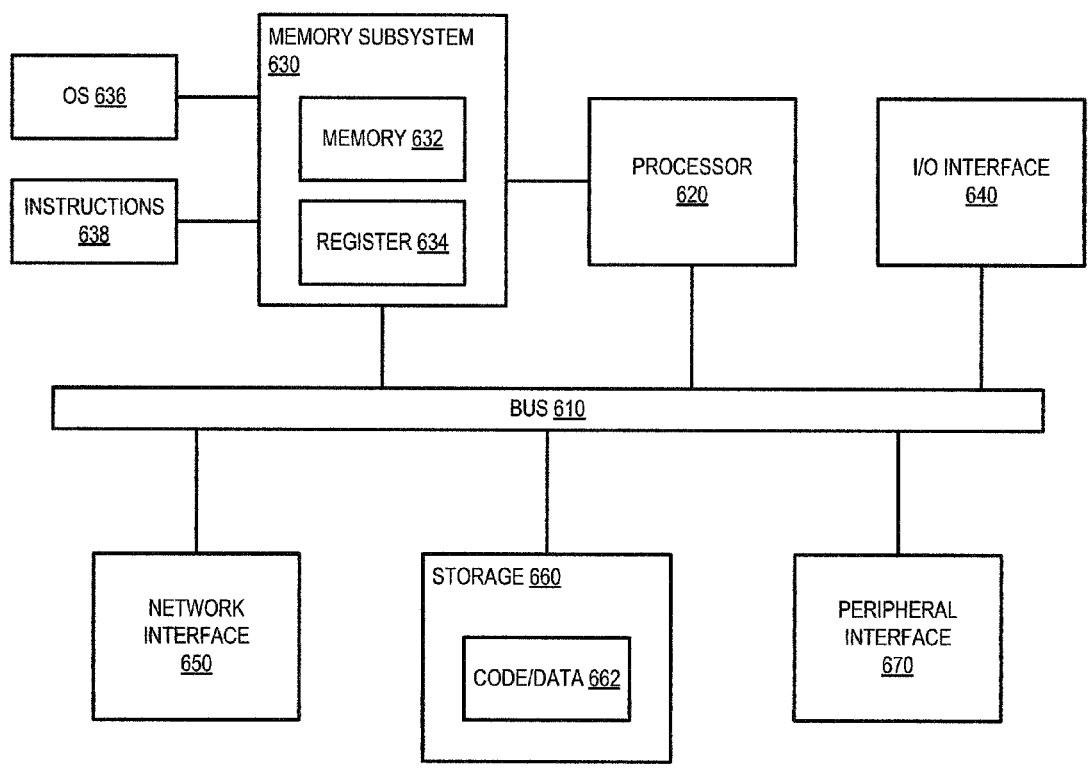
FIG. 6 is a block diagram of an embodiment of a computing system in which a register of the memory subsystem is accessed indirectly by a host processor.

FIG. 6 is a block diagram of an embodiment of a computing system in which a register of the memory subsystem is accessed indirectly by a host processor. System 600 represents a computing device in accordance with any embodiment described herein, and can be a laptop computer, a desktop computer, a server, a gaming or entertainment control system, a scanner, copier, printer, or other electronic device. System 600 includes processor 620, which provides processing, operation management, and execution of instructions for system 600. Processor 620 can include any type of microprocessor, central processing unit (CPU), processing core, or other processing hardware to provide processing for system 600. Processor 620 controls the overall operation of system 600, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 630 represents the main memory of system 600, and provides temporary storage for code to be executed by processor 620, or data values to be used in executing a routine. Memory subsystem 630 includes memory 632, which represents one or more memory devices that can include read-only memory (ROM), flash memory, one or more varieties of random access memory (RAM), or other memory devices, or a combination of such devices. In one embodiment, memory 632 includes at least one DRAM device. Memory subsystem 630 includes register 634, which represents a register that is not directly readable by processor 620. Such a register can be referred to as an isolated register, and can be read indirectly as described herein.

Memory subsystem 630 stores and hosts, among other things, operating system (OS) 636 to provide a software platform for execution of instructions in system 600. Additionally, other instructions 638 are stored and executed from memory subsystem 630 to provide the logic and the processing of system 600. OS 636 and instructions 638 are executed by processor 620.

Processor 620 and memory subsystem 630 are coupled to bus/bus system 610. Bus 610 is an abstraction that represents any one or more separate physical buses, communication lines/interfaces, and/or point-to-point connections, connected by appropriate bridges, adapters, and/or controllers. Therefore, bus 610 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 610 can also correspond to interfaces in network interface 650.

In one embodiment, bus 610 includes a data bus that is a data bus included in memory subsystem 630 over which processor 630 can read values from memory 632. The additional line shown linking processor 620 to memory subsystem 630 represents a command bus over which processor 620 provides commands and addresses to access memory 632. Register 634 is connected to a data bus of memory subsystem 630, but not to the data bus of bus 610.

System 600 also includes one or more input/output (I/O) interface(s) 640, network interface 650, one or more internal mass storage device(s) 660, and peripheral interface 670 coupled to bus 610. I/O interface 640 can include one or more interface components through which a user interacts with system 600 (e.g., video, audio, and/or alphanumeric interfacing). Network interface 650 provides system 600 the ability to communicate with remote devices (e.g., servers, other computing devices) over one or more networks. Network interface 650 can include an Ethernet adapter, wireless interconnection components, USB (universal serial bus), or other wired or wireless standards-based or proprietary interfaces.

Storage 660 can be or include any conventional medium for storing large amounts of data in a nonvolatile manner, such as one or more magnetic, solid state, or optical based disks, or a combination. Storage 660 holds code or instructions and data 662 in a persistent state (i.e., the value is retained despite interruption of power to system 600). Storage 660 can be generically considered to be a "memory," although memory 630 is the executing or operating memory to provide instructions to processor 620. Whereas storage 660 is nonvolatile, memory 632 can include volatile memory (i.e., the value or state of the data is indeterminate if power is interrupted to system 600).

Peripheral interface 670 can include any hardware interface not specifically mentioned above. Peripherals refer generally to devices that connect dependently to system 600. A dependent connection is one where system 600 provides the software and/or hardware platform on which operation executes, and with which a user interacts.

Figure 7:
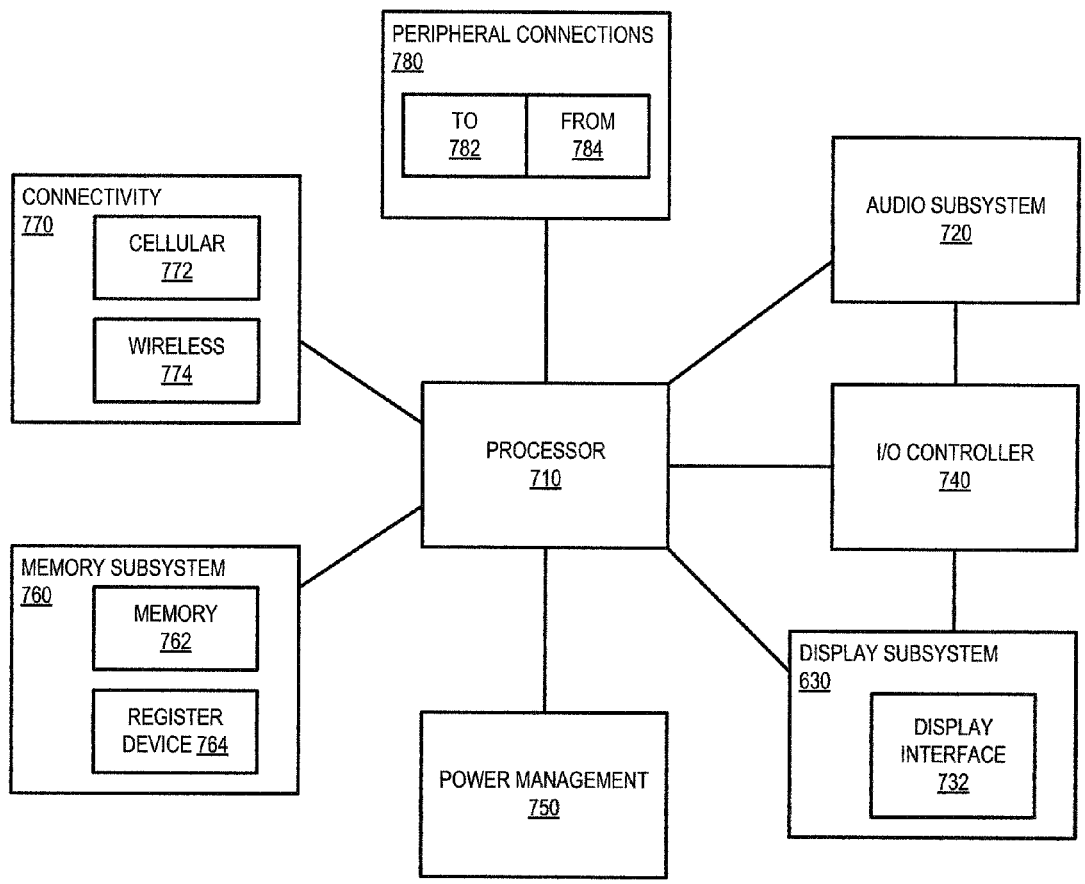
FIG. 7 is a block diagram of an embodiment of a mobile device in which a register of the memory subsystem is accessed indirectly by a host processor.

FIG. 7 is a block diagram of an embodiment of a mobile device in which a register of the memory subsystem is accessed indirectly by a host processor. Device 700 represents a mobile computing device, such as a computing tablet, a mobile phone or smartphone, a wireless-enabled e-reader, or other mobile device. It will be understood that certain of the components are shown generally, and not all components of such a device are shown in device 700.

Device 700 includes processor 710, which performs the primary processing operations of device 700. Processor 710 can include one or more physical devices, such as microprocessors, application processors, microcontrollers, programmable logic devices, or other processing means. The processing operations performed by processor 710 include the execution of an operating platform or operating system on which applications and/or device functions are executed. The processing operations include operations related to I/O (input/output) with a human user or with other devices, operations related to power management, and/or operations related to connecting device 700 to another device. The processing operations can also include operations related to audio I/O and/or display I/O.

In one embodiment, device 700 includes audio subsystem 720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 700, or connected to device 700. In one embodiment, a user interacts with device 700 by providing audio commands that are received and processed by processor 710.

Display subsystem 730 represents hardware (e.g., display devices) and software (e.g., drivers) components that provide a visual and/or tactile display for a user to interact with the computing device. Display subsystem 730 includes display interface 732, which includes the particular screen or hardware device used to provide a display to a user. In one embodiment, display interface 732 includes logic separate from processor 710 to perform at least some processing related to the display. In one embodiment, display subsystem 730 includes a touchscreen device that provides both output and input to a user.

I/O controller 740 represents hardware devices and software components related to interaction with a user. I/O controller 740 can operate to manage hardware that is part of audio subsystem 720 and/or display subsystem 730. Additionally, I/O controller 740 illustrates a connection point for additional devices that connect to device 700 through which a user might interact with the system. For example, devices that can be attached to device 700 might include microphone devices, speaker or stereo systems, video systems or other display device, keyboard or keypad devices, or other I/O devices for use with specific applications such as card readers or other devices.

As mentioned above, I/O controller 740 can interact with audio subsystem 720 and/or display subsystem 730. For example, input through a microphone or other audio device can provide input or commands for one or more applications or functions of device 700. Additionally, audio output can be provided instead of or in addition to display output. In another example, if display subsystem includes a touchscreen, the display device also acts as an input device, which can be at least partially managed by I/O controller 740. There can also be additional buttons or switches on device 700 to provide I/O functions managed by I/O controller 740.

In one embodiment, I/O controller 740 manages devices such as accelerometers, cameras, light sensors or other environmental sensors, gyroscopes, global positioning system (GPS), or other hardware that can be included in device 700. The input can be part of direct user interaction, as well as providing environmental input to the system to influence its operations (such as filtering for noise, adjusting displays for brightness detection, applying a flash for a camera, or other features).

In one embodiment, device 700 includes power management 750 that manages battery power usage, charging of the battery, and features related to power saving operation. Memory subsystem 760 includes memory devices for storing information in device 700. Memory can include non-volatile (state does not change if power to the memory device is interrupted) and/or volatile (state is indeterminate if power to the memory device is interrupted) memory devices. Memory resources of memory subsystem 760 can store application data, user data, music, photos, documents, or other data, as well as system data (whether long-term or temporary) related to the execution of the applications and functions of system 700.

In one embodiment, at least one memory device 762 includes a register directly accessible by processor 710. Register device 764 of memory subsystem 760 is outside memory devices 762, and is not directly accessible by processor 710, but is communicatively coupled to memory device 762 via an address bus, as described above. Data stored in register device 764 can be transferred to the register of memory device 762 to be read by processor 710.

Connectivity 770 includes hardware devices (e.g., wireless and/or wired connectors and communication hardware) and software components (e.g., drivers, protocol stacks) to enable device 700 to communicate with external devices. The device could be separate devices, such as other computing devices, wireless access points or base stations, as well as peripherals such as headsets, printers, or other devices.

Connectivity 770 can include multiple different types of connectivity. To generalize, device 700 is illustrated with cellular connectivity 772 and wireless connectivity 774. Cellular connectivity 772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 774 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 780 include hardware interfaces and connectors, as well as software components (e.g., drivers, protocol stacks) to make peripheral connections. It will be understood that device 700 could both be a peripheral device ("to" 782) to other computing devices, as well as have peripheral devices ("from" 784) connected to it. Device 700 commonly has a "docking" connector to connect to other computing devices for purposes such as managing (e.g., downloading and/or uploading, changing, synchronizing) content on device 700. Additionally, a docking connector can allow device 700 to connect to certain peripherals that allow device 700 to control content output, for example, to audiovisual or other systems.

In addition to a proprietary docking connector or other proprietary connection hardware, device 700 can make peripheral connections 780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Flow diagrams as illustrated herein provide examples of sequences of various process actions. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. An apparatus comprising:
   a dynamic random access memory (DRAM) comprising at least one page having at least one multipurpose register (MPR) and comprising:
   a first interface that, when operatively coupled to an address bus, is to receive a control word (CW) and provide the CW to a particular MPR and
   a second interface communicatively coupled to the at least one page having at least one MPR, wherein:
   the at least one page having at least one MPR to be written-to using the first interface during a coupling of the first interface to the address bus and to be read-from using the second interface during a coupling of the second interface to a data bus.

2. The apparatus of claim 1, wherein the CW comprises a 4-bit CW or an 8-bit CW.

3. The apparatus of claim 1, wherein the particular MPR comprises an MPR number zero (MPR0) of page 0 and the CW is associated with a command CMD4.

4. The apparatus of claim 1, wherein:
   the CW is associated with a read operation,
   the read operation is associated with an 8-bit value having positions [7:0] and having at least an MPR bit 1 in position 6 and an MPR bit 0 in position 5, and
   a combination of MPR bit 1 and bit 0 to select a particular MPR number.

5. The apparatus of claim 1, wherein:
   the CW is associated with a read operation with auto-increment of an address field,
   the read operation with auto-increment of an address field is associated with an 8-bit value having positions [7:0] and having at least an MPR bit 1 in position 6 and an MPR bit 0 in position 5, and
   a combination of MPR bit 1 and bit 0 to select a particular MPR number.

6. The apparatus of claim 1, further comprising:
   an address bus communicatively coupled to the first interface;
   a register communicatively coupled to the address bus; and
   a memory controller communicatively coupled to the register, the memory controller to:
   provide the CW to the register,
   select a page and MPR within the selected page to receive the CW, and
   provide one or more commands to cause writing of the CW to the selected page and MPR.

7. The apparatus of claim 6, further comprising:
   a data bus communicatively coupled to the second interface and
   a processor communicatively coupled to the data bus, wherein:
   the data bus interface is to provide content from an MPR to the processor via the data bus.

8. The apparatus of claim 6, wherein the register is to perform parity checking.

9. A computer-implemented method comprising:
   receiving, at a multipurpose register (MPR), a control word (CW) from an address bus interface, wherein the MPR is associated with a dynamic random access memory (DRAM) and wherein the CW is received during a coupling of the address bus interface with an address bus, and
   transmitting content from the MPR using a data bus interface during a coupling of the data bus interface with a data bus.

10. The method of claim 9, wherein the CW comprises a 4-bit CW or an 8-bit CW.

11. The method of claim 9, wherein the MPR comprises an MPR number zero (MPR0) of a page 0 and the CW is associated with a command CMD4.

12. The method of claim 9, wherein:
   the CW is associated with a read operation,
   the read operation is associated with an 8-bit value having positions [7:0] and having at least an MPR bit 1 in position 6 and an MPR bit 0 in position 5, and
   a combination of MPR bit 1 and bit 0 to select a particular MPR number.

13. The method of claim 9, wherein:
   the CW is associated with a read operation with auto-increment of an address field,
   the read operation with auto-increment of an address field is associated with an 8-bit value having positions [7:0] and having at least an MPR bit 1 in position 6 and an MPR bit 0 in position 5, and
   a combination of MPR bit 1 and bit 0 to select a particular MPR number.

14. An apparatus to write a control word (CW), the apparatus comprising:
   a register;
   a memory controller to provide a command, the command to cause the register to write a CW to at least one multipurpose register (MPR) associated with a dynamic random access memory (DRAM); and
   an address bus interface communicatively coupled to the register, the address bus interface to provide the CW for transfer to an MPR associated with the command.

15. The apparatus of claim 14, wherein the command comprises a command CMD4 to send a CW to MPR0 of page 0 and the MPR0 of page 0 is to receive the CW from an address bus.

16. The apparatus of claim 14, wherein:
the CW is associated with a read operation,
the read operation is associated with an 8-bit value having positions [7:0] and having at least an MPR bit 1 in position 6 and an MPR bit 0 in position 5, and
a combination of MPR bit 1 and bit 0 to select a particular MPR number.

17. The apparatus of claim 14, wherein:
the CW is associated with a read operation with auto-increment of an address field,
the read operation with auto-increment of an address field is associated with an 8-bit value having positions [7:0] and having at least an MPR bit 1 in position 6 and an MPR bit 0 in position 5, and
a combination of MPR bit 1 and bit 0 to select a particular MPR number.

18. The apparatus of claim 14, wherein the memory controller comprises any or a combination of: software executed by one or more processors, hardware, or firmware.

19. The apparatus of claim 14, further comprising:
a memory device comprising the DRAM, the DRAM comprising at least one page having at least one MPR;
an address bus communicatively coupled to the address bus interface and to the memory device;
a data bus communicatively coupled to the at least one MPR; and
a processor communicatively coupled to the data bus, wherein the MPR is to provide content to the processor via the data bus.

20. The apparatus of claim 19, further comprising:
a physical layer logic;
a radio communicatively coupled to the physical layer logic;
at least one antenna communicatively coupled to the radio; and
a display communicatively coupled to the processor.

* * * * *

UNITED STATES PATENT AND TRADEMARK OFFICE
CERTIFICATE OF CORRECTION

| | |
|---|---|
| PATENT NO. | : 9,436,632 B2 |
| APPLICATION NO. | : 14/560976 |
| DATED | : September 6, 2016 |
| INVENTOR(S) | : Bains et al. |

Page 1 of 1

It is certified that error appears in the above-identified patent and that said Letters Patent is hereby corrected as shown below:

On the title page, at Related U.S. Application Data (63), after "Dec. 22, 2011", insert --now Pat. No. 9,442,871.--.

Signed and Sealed this
Twenty-fifth Day of October, 2016

Michelle K. Lee
*Director of the United States Patent and Trademark Office*